United States Patent [19]

Carter et al.

[11] 4,274,017
[45] Jun. 16, 1981

[54] CASCODE POLARITY HOLD LATCH HAVING INTEGRATED SET/RESET CAPABILITY

[75] Inventors: Eric L. Carter, Endicott; Eugene J. Nosowicz, Vestal, both of N.Y.

[73] Assignee: International Business Machines Corporation, Armonk, N.Y.

[21] Appl. No.: 973,426

[22] Filed: Dec. 26, 1978

[51] Int. Cl.³ .............................................. H03K 3/29
[52] U.S. Cl. .................................. 307/289; 307/290; 307/291; 307/DIG. 3
[58] Field of Search ................. 357/289, 291, DIG. 3, 357/272 A, 362; 307/289, 290, 291, DIG. 3; 328/196

[56] References Cited

U.S. PATENT DOCUMENTS

| | | |
|---|---|---|
| 3,307,047 | 2/1967 | Narud et al. .......................... 307/291 |
| 3,401,273 | 9/1968 | May ...................................... 307/291 |
| 3,437,844 | 4/1969 | Chua ..................................... 307/289 |
| 3,509,366 | 4/1970 | Howe, Jr. et al. .................... 307/289 |
| 3,573,488 | 4/1971 | Beelitz .................................. 307/289 |
| 3,671,763 | 6/1972 | Maley et al. ......................... 307/289 |
| 3,679,915 | 7/1972 | Kriger .................................. 307/289 |
| 3,767,944 | 10/1973 | Stehlin ................................. 307/289 |
| 3,818,250 | 6/1974 | Reed et al. ........................... 307/289 |
| 3,986,057 | 10/1976 | Eichelberger et al. .............. 307/289 |
| 3,993,919 | 11/1976 | Cox et al. ............................. 307/289 |

*Primary Examiner*—Larry N. Anagnos
*Assistant Examiner*—B. P. Davis
*Attorney, Agent, or Firm*—Saul A. Seinberg

[57] ABSTRACT

An improved polarity hold latch is described having a set and reset capability integrated therein. As implemented, this latch provides the desired logical functions at a reduced circuit cost and power requirements. At the same time, it overcomes the need to test for and resolve potential signal race conditions. The improved latch is particularly susceptible of being implemented on a single chip.

1 Claim, 4 Drawing Figures

CASCODE POLARITY HOLD LATCH HAVING INTEGRATED SET/RESET CAPABILITY

CROSS REFERENCE TO RELATED APPLICATION

This application is related to commonly assigned U.S. Pat. No. 4,165,490, issued on Aug. 21, 1979 to Howe et al for "Clock Pulse Generator With Selective Pulse Delay And Pulse Width Control". In the Howe et al patent, a clock gate generator is shown which can be implemented in accordance with the teachings of the present invention.

BACKGROUND OF THE INVENTION

1. Field of the Invention

This invention relates to a latch circuit and more particularly to a high performance latching circuit having an integrated set and reset capability.

2. Description of the Prior Art

Clocked latching circuits are well known in the prior art as bistable circuits having both clock and data signal inputs wherein the output is not altered from a given state until the occurrence of an input clock signal. It is often desirable to add a set and reset capability to such devices so that their output state can be placed at a known logical condition without having to provide an input clock signal. Typically, the set/reset capability is added at the cost of several circuit elements and additional power requirements. Further, the added logic elements require that a designer test for and resolve potential signal race conditions in order to be sure that the latch will switch when and as desired.

OBJECTS AND SUMMARY OF THE INVENTION

Accordingly, it is a principal object of the present invention to overcome the limitations of the prior art and provide a polarity hold latch which can readily have a set/reset capability function integrated therein.

Another object of the present invention is to provide such an improved polarity hold latch which is free from race condition problems.

A more specific object of the present invention is to provide a polarity hold latch having a set/reset capability at the lowest cost in additional circuit elements and power requirements.

Yet another object of the present invention is to provide an improved polarity hold latch which has an integrated set/reset capability and which is easily implementable in semiconductor chip technology.

The foregoing and other objects of the present invention are accomplished by providing a polarity hold latch having a number of semiconductor switching devices and other elements interconnected to provide a bistable circuit. Additional semiconductor switching devices adapted to receive set and reset signals are then operatively coupled therein to override the normal, expected switching action of the latch and force its output to a set or reset state, as is appropriate.

DESCRIPTION OF THE PREFERRED EMBODIMENT

Figure 1:
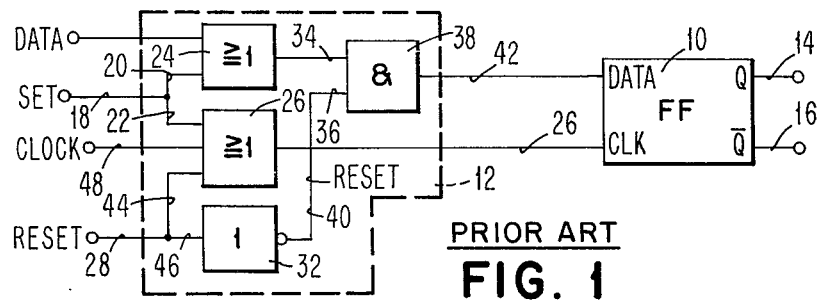
FIG. 1 depicts a prior art polarity hold latch having a set/reset capability added thereto by the provision of additional and external logic elements.

Referring now to the drawings wherein like reference numerals have been used in the several views thereof to identify like elements, FIG. 1 depicts a possible prior art arrangement wherein a cascode polarity hold latch 10 is provided with a set/reset capability through the use of additional and external logic circuitry 12. The cascode polarity latch 10 is illustrated in greater detail in FIG. 2.

The set/reset capability is added to the latch 10 so that it may be set after power-up or at any other appropriate time to a predetermined logical output state. By convention, and as used herein, a SET of the latch 10 will cause a logical 1 to appear at its Q output 14 while a RESET will cause its Q output line 14 to be at a logical "0". The $\bar{Q}$ output line 16 will be forced to the opposite logical state of the two possible states which the Q output line 14 exhibits.

As used herein, a reference to the presence of a pulse means that the input line on which it appears is at a logical "1". The absence of a pulse means that the input line is, conversely, at a logical "0". Further, in the following description of latch 10 and 10' operation, it is assumed that the clock input pulse will not be present during the SET/RESET mode.

In operation, this prior art arrangement works in the following manner. Assuming for the sake of explanation that the latch 10 has experienced power-on, its output lines will be in an unpredictable state. At this point, it will be further assumed that the latch's Q output line 14 should be at a logical "1". This is achieved by enabling the SET line 18 bringing it to a logical "1" level. When this occurs, the input lines 20 and 22 of OR gates 24 and 26 respectively are both set to a logical "1". This action, in turn, enables both OR gates 24 and 26 which brings input line 34 of AND gate 38 to a logical "1". It also sets the clock input line 26 of latch 10 to a logical "1". It should be noted that the clock input line 26 is enabled by the SET signal after only one stage of delay, that inherently introduced by the OR gate 26.

In the absence of a RESET signal on line 28, a logical "0" is passed to the inverter 32 which, in turn, causes the $\overline{\text{RESET}}$ line 40 to be set to a logical "1". This results in the logical "1" signal being presented to the other input line 36 of AND gate 38. Since its other input line 34 is already set to a logical "1", AND gate 38 is enabled which sets the data input line 42 of latch 10 to a logical "1". It should be noted that the data input line 42 is enabled by the SET signal after two stages of delay, that inherently introduced by the AND gate 38 in combination with the OR gate 24.

Since the condition of the data line 42 at the time of the trailing edge of the logic signal on the clock line 26 is what is presented on the latch's Q output line 14, it is imperative that the circuit designer make sure the proper timing conditions occur. Unfortunately, as noted above, the polarity hold data and clock input signals originate from the same source, the SET signal, but experience different stages of propagation. It is therefore necessary for the circuit designer to consider and accurately resolve the potential data/clock race condition.

The RESET signal, which causes the Q output line 14 to be set to a logical "0" also poses the same problem for the circuit designer. When the RESET input line 28 is enabled or set to a logical "1", it enables input line 44 to the OR gate 26 and the input line 46 to inverter 32. The $\overline{\text{RESET}}$ line 40 and input 36 of the AND gate 38 are thereby set to a logical "0". Since at least one of its inputs is now at a logical "0", AND gate 38 is disabled causing the data line 42 of latch 10 to be set to a logical zero. OR gate 26 is enabled by the logical "1" state of input line 44 and thereby provides a logical "1" signal on the clock input line 26 of latch 10. The clock input line 48 serves as a means for introducing the normal gating signals to the illustrated arrangement.

Again, the polarity hold data and clock input line signals originate from the same source and at the same time, but experience different stages of propagation. Therefore, the typical prior art arrangement for providing a SET/RESET capability to a cascode polarity hold latch will require resolution of a potential data/clock race condition regardless of its mode of operation; i.e., whether SET or RESET is attempted. Further, it should be recognized that this capability requires the use of at least four additional circuit elements.

Figure 2:
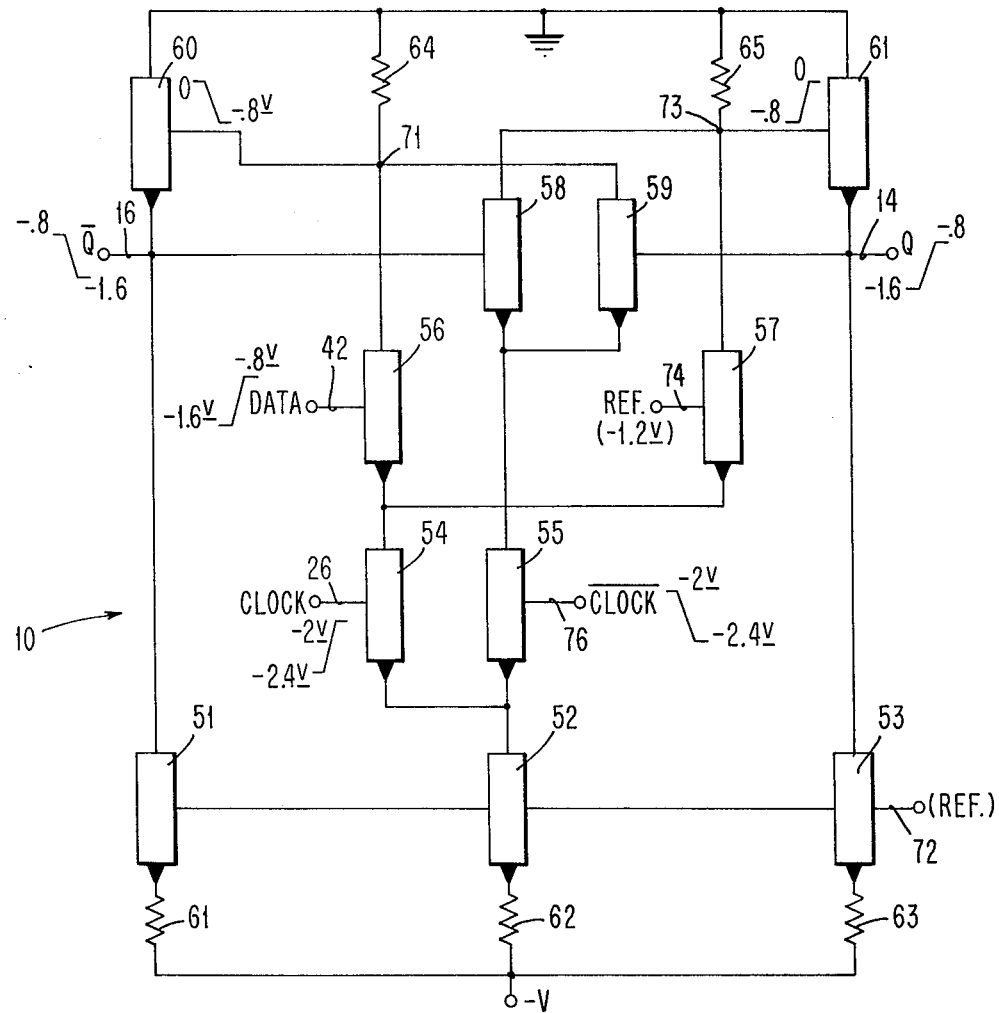
FIG. 2 shows a detailed schematic or a prior art polarity hold latch.

A typical cascode polarity hold latch is shown in greater detail in FIG. 2. It will again be assumed that the latch 10 has been powered on and that its Q output line 14 is at a logical "1". Independent of the latch state, transistors 51, 52 and 53, in conjunction with resistors 61, 62 and 63 respectively, act as current sources for each of three legs of the latch 10. Transistors 60 and 61 are therefore always on and serve as level translators as shall be hereinafter explained.

With the latch 10 powered on, the clock signal line 26 at a logical "0", and the Q output line 14 thereof at a logical "1", transistor 59 of the differential or latch pair, transistors 58 and 59, is on. Since the clock signal line 26 is at a logical "0", its complementary input line 76 will be at a logical "1". This means that current from transistors 52 and 55 is steered to and through transistor 59, causing the node 71 to be kept low and node 73 to be kept high. The current flow through resistor 64 yields a voltage drop thereacross holding node 71 lower in potential than node 73. When node 73 is high, the base of transistor 61 is high causing its emitter, which is connected to the Q output 14, to be higher in potential than the emitter of transistor 60 which is connected to the Q output 16. The difference in potential, which can be seen in FIG. 2, is essentially the voltage drop across resistor 64.

Thereafter, when a clock pulse is received on the clock input line 26, transistor 54 is turned on and the $\overline{\text{CLOCK}}$ transistor 55 is turned off. In the absence of a data pulse on the data pulse input line 42, current is steered through the reference voltage transistor 57 which sets the node 73 low and the node 71 high. When node 73 goes low, meaning current is being drawn through resistor 65, transistor 61 shows a low potential at its emitter setting the Q output line 14 to a logical "0". Thus, enabling the clock pulse line in the absence of a data pulse sets the Q output line 14 of latch 10 to a logical condition which reflects the state of the data pulse line 42. This action turns on transistor 58 when the clock pulse is removed and the latch pair is kept in this state for as long as the nodes 71 and 73 are held at their respective potentials.

When a data pulse is received, during the presence of a clock pulse, transistor 56 is turned on and current is now directed through transistors 54 and 56 which causes the node 71 to be set low and node 73 to be set high. This switches the state of the latch pair from their prior status and forces the Q output line to be set to a logical "1", this state being thereafter held when the clock pulse is removed.

Figure 3:
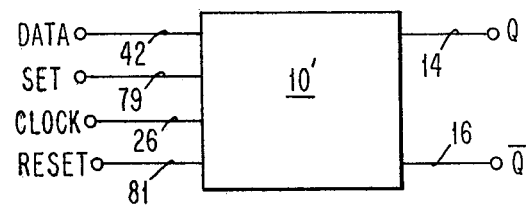
FIG. 3 illustrates a generalized representation of a polarity hold latch implemented in accordance with the present invention.

A cascode polarity hold latch 10' having an integrated SET/RESET capability is shown generally in FIG. 3. Although not directly apparent therefrom, the latch 10' requires no extra power nor does it introduce any delays beyond that already inherent in the basic polarity hold circuitry itself. Further, the intergrated latch 10' does not require as many circuit elements as did the prior art arrangement depicted in FIG. 1.

Figure 4:
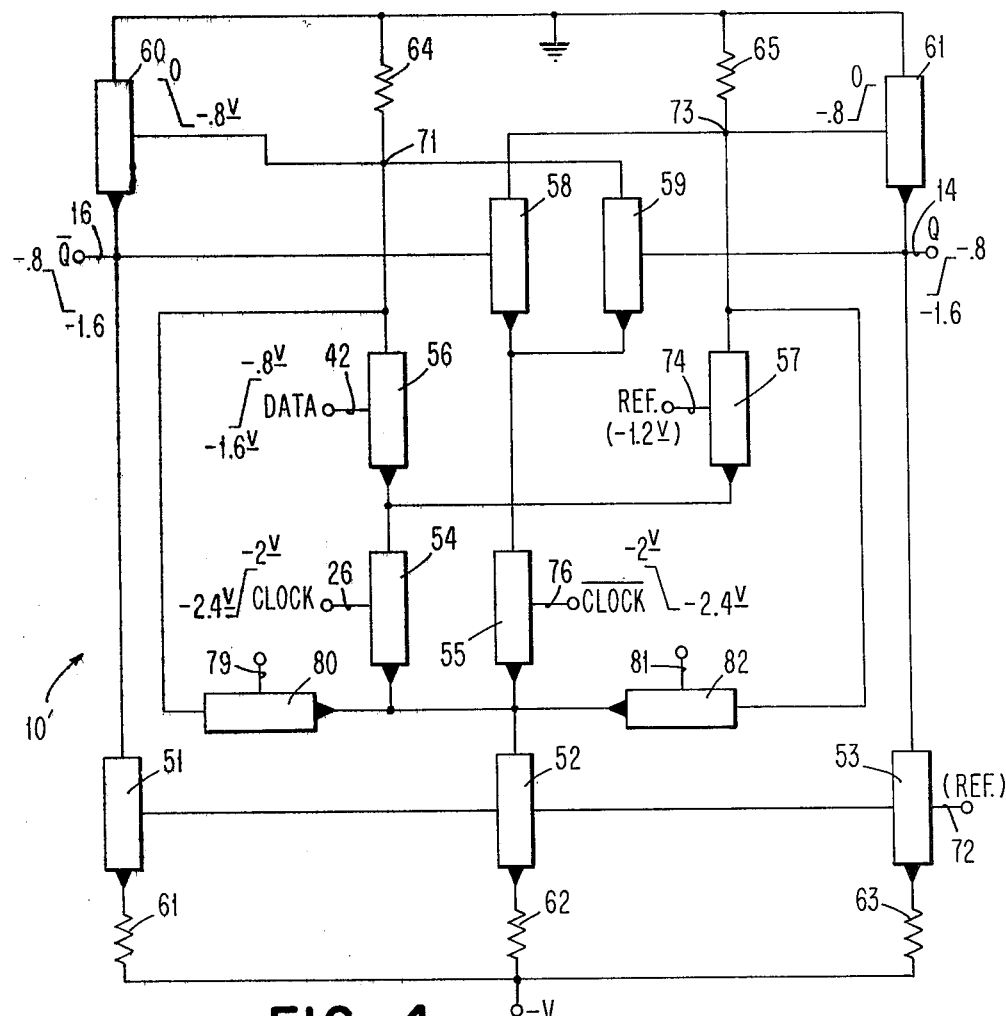
FIG. 4 depicts a detailed schematic diagram of the polarity hold latch shown in FIG. 3.

FIG. 4 is a more detailed illustration of the latch 10' and, in operation, it functions as did the latch 10 shown in FIG. 2 with the following exceptions. Transistors 80 and 82 have been added. Input line 79 to the base of transistor 80 serves as the SET line and input line 81 to the base of transistor 82 serves as the RESET line for the latch 10'. Transistor 80 is connected across transistors 54 and 56 so that the presence of a SET pulse causes the latch 10' to operate as it did when transistors 54 and 56 were on. This means that when transistor 80 is turned on, node 71 is brought to a low potential and the Q output line 14 is set to a logical "1". Conversely, transistor 82, which is connected across transistors 54 and 57, when turned on by a RESET pulse, causes the latch 10' to operate as it did when transistors 54 and 57 were on. This means that when transistor 82 is turned on, node 73 is brought to a low potential and the Q output line 14 is set to a logical "0".

During the presence of a SET or RESET input pulse on lines 79 or 81 respectively, transistors 58 and 59, while forward biased, are not in a conductive state. When the SET or RESET input pulse is removed, either device 80 or 82 is turned off and current flow through transistor 55 is established. This causes transistor 59 of the latch pair to be turned on. The state of latch 10' will thereafter remain the same, as determined by whether it had responded to a SET or RESET pulse, until acted upon by a subsequent enabling signal. The highest base potential available at transistors 54, 55, 80 or 82 therefore determines the current flow path which ultimately brings the Q and $\overline{\text{Q}}$ output lines 14 and 16 respectively to the desired logical state.

It should be noted that the SET/RESET up levels are preferably set above the up level of the differential clock signal, in this case by 400 millivolts. Therefore, when either the SET or RESET input is present, it overrides the clock and data inputs, if present, and switches the latch 10' output accordingly. When the SET or RESET signal that toggled the latch 10' comes down, the clock input 26 is permitted to function again as a responsive latch input.

Because the SET/RESET capability is achieved without involving the clock or data circuit elements, there are no race conditions to be resolved. Further, the necessary SET/RESET voltage levels are obtained by diode shifted on-chip levels. This is achieved through the simple expedient of inserting a diode in the output emitter follower state of a drive circuit.

While the present invention has been described in the context of the preferred embodiment thereof, it will be readily apparent to those skilled in the art that other modifications and variations can be made therein without departing from the spirit or scope of the present invention. Accordingly, it is not intended that the present invention be limited to the specifics of the foregoing description of the preferred embodiment, but rather as being limited only by the scope of the invention as it is defined in the claims appended hereto.

Having thus described my invention, what I claim as new, and desire to secure by Letters Patent is:

1. In a polarity hold latch circuit having a plurality of semiconductor switching devices interconnected to provide a bistable circuit and including, a first semiconductor switching device coupled to such bistable circuit and having an input terminal for receiving a binary data signal, a second semiconductor switching device coupled in circuit with the first semiconductor switching device and having an input terminal for receiving a clock signal to assist in enabling the binary level of the data signal supplied to the first device to determine the state of the bistable circuit and a third semiconductor switching device for supplying a reference voltage source under predetermined input conditions also coupled in the bistable circuit through its output between said first and second devices to assist in enabling, upon receipt of a clock signal by the second device, a change in the state of the bistable circuit, the improvement comprising:

a fourth semiconductor switching device coupled across the first and second device and having an input terminal for receiving a set signal and in response thereto overriding the actions of any signals received by the first and second devices and forcing the bistable circuit to a set state; and a fifth semiconductor switching device coupled across the second and third devices and having an input terminal for receiving a reset signal and in response thereto overriding the actions of any signals received by the first and second devices and forcing the bistable circuit to a reset state.

* * * * *

UNITED STATES PATENT AND TRADEMARK OFFICE
CERTIFICATE OF CORRECTION

PATENT NO. : 4,274,017
DATED : June 16, 1981
INVENTOR(S) : Eric L. Carter et al

It is certified that error appears in the above-identified patent and that said Letters Patent are hereby corrected as shown below:

Column 3, line 49, "Q" should read --$\bar{Q}$--.

Column 6, line 8, "device" should read --devices--.

Signed and Sealed this

Twenty-fifth Day of August 1981

[SEAL]

Attest:

GERALD J. MOSSINGHOFF

Attesting Officer

Commissioner of Patents and Trademarks